US009788410B2

(12) United States Patent
Uchiyama et al.

(10) Patent No.: US 9,788,410 B2
(45) Date of Patent: Oct. 10, 2017

(54) PRINTED CIRCUIT BOARD AND POWER SUPPLY DEVICE (71) Applicant: TDK CORPORATION, Tokyo (JP)

(72) Inventors: Tomohiko Uchiyama, Tokyo (JP); Yasuhiro Murai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/457,709

(22) Filed: Aug. 12, 2014

(65) Prior Publication Data

US 2015/0048917 A1    Feb. 19, 2015

(30) Foreign Application Priority Data

Aug. 13, 2013    (JP) .................. 2013-168115

(51) Int. Cl.
| H01F 21/08 | (2006.01) |
| H01F 27/24 | (2006.01) |
| H05K 1/02 | (2006.01) |
| H01F 27/28 | (2006.01) |
| H05K 7/14 | (2006.01) |
| H05K 3/28 | (2006.01) |
| H05K 1/16 | (2006.01) |

(52) U.S. Cl.
CPC ....... *H05K 1/0209* (2013.01); *H01F 27/2804* (2013.01); *H05K 3/28* (2013.01); *H05K 7/1432* (2013.01); *H01F 2027/2819* (2013.01); *H05K 1/165* (2013.01); *H05K 2201/0191* (2013.01); *H05K 2201/086* (2013.01); *H05K 2201/09063* (2013.01)

(58) Field of Classification Search
CPC .... H05K 1/0209; H05K 1/165; H05K 7/1432; H05K 2201/086; H05K 1/16; H05K 7/1427; H05K 7/14; H05K 3/28; H05K 2201/09063; H01F 27/2804; H01F 27/24; H01F 27/08; H01F 27/22; H01F 27/28; H01F 2027/2819
USPC .................. 336/200, 61, 212, 232
See application file for complete search history.

(56) References Cited

U.S. PATENT DOCUMENTS

| 5,973,923 | A | * | 10/1999 | Jitaru | ............................ 361/704 |
| 6,201,696 | B1 | * | 3/2001 | Shimizu | .................. H01L 23/24 165/80.2 |
| 6,366,486 | B1 | * | 4/2002 | Chen | ....................... H02M 3/00 361/707 |
| 6,770,822 | B2 | * | 8/2004 | Pasternak | ............. H01L 23/055 174/251 |

(Continued)

FOREIGN PATENT DOCUMENTS

| JP | A-11-163476 | 6/1999 |
| JP | A-2009-54857 | 3/2009 |
| JP | A-2010-153722 | 7/2010 |

*Primary Examiner* — Mangtin Lian
(74) *Attorney, Agent, or Firm* — Oliff PLC (57) ABSTRACT

In the printed circuit board 100 in the power supply device, cover layers C1 and C2 are formed on a surface other than the connection areas 95A' and 95B' within a coil pattern EC, which corresponds to a surface-shaped exposure area exposed to the outside so that the size of the surface-shaped exposure area to which the conductive pattern E is exposed is adjusted, so that an effect, which restrains a conductor from being damaged, especially at a time of carrying the printed circuit board 100 while maintaining a heat radiating property of the conductor, is achieved.

3 Claims, 6 Drawing Sheets

(56) References Cited

U.S. PATENT DOCUMENTS

| | | | |
|---|---|---|---|
| 2007/0053157 A1* | 3/2007 | Huang | H05K 7/1411 361/688 |
| 2007/0296533 A1* | 12/2007 | Springett | H01F 27/22 336/200 |
| 2010/0164670 A1 | 7/2010 | Nakahori et al. | |
| 2012/0195005 A1* | 8/2012 | Asano | H01F 27/22 361/710 |
| 2014/0327505 A1* | 11/2014 | Schekulin | H01F 37/00 336/55 |
| 2016/0035481 A1* | 2/2016 | Hachiya | H01F 27/2876 336/61 |

* cited by examiner

PRINTED CIRCUIT BOARD AND POWER SUPPLY DEVICE

TECHNICAL FIELD

The present invention relates to a printed circuit board in which wiring is printed and a power supply device including the printed circuit board.

BACKGROUND

From the conventional art, a plurality of electronic components which generate heat are mounted to a printed circuit board used for a power supply device, etc., so that a plurality of methods of improving a heat radiating property has been considered. For example, a configuration in which a circuit board is placed on a heat radiating plate is disclosed in Japanese Patent Laid-Open Publication No. 2010-153722.

SUMMARY

Here, as disclosed in Japanese Patent Publication No. 2010-153722, in a case where heat is dissipated by placing a printed circuit board on a heat radiating plate, a method of allowing a conductive layer having a high heat radiating property among materials constituting a printed circuit board to be in thermal contact with a heat sink by exposing the conductive layer may be considered as a method of further improving a heat radiating property. However, in a case where the conductive layer is exposed, when the printed circuit boards overlap each other in order to carry the printed circuit boards, it is possible that the printed circuit boards are in contact with each other so as to be damaged. Further, in the worst case, destruction, functional deterioration, etc. of a power supply device itself, which are caused by disconnection of the conductive layer, may be generated.

Aspects of the present invention are conceived to address at least the above-mentioned problems and/or disadvantages. Accordingly, an aspect of the present invention is to provide a printed circuit board of which the heat radiating property is maintained to be high while restraining destruction, and a power supply device including the printed circuit board.

In order to solve the aforementioned problems, a printed circuit board according to an aspect of the present invention corresponds to a printed circuit board having a conductive pattern formed on at least one surface of a substrate comprised of an insulation material, wherein the conductive pattern has a surface-shaped exposure area comprising a connection area thermally connected to a heat radiating member, and a covered area where a cover layer is formed on a surface of an area other than the connection area.

Further, A power supply device according to an aspect of the present invention including: the printed circuit board; and, a housing for accommodating the printed circuit board, wherein the surface-shaped exposure area is installed on a lower surface of the printed circuit board, the surface-shaped exposure area is thermally connected to the housing, and a bottom surface of the housing functions as the heat radiating member.

In accordance with the printed circuit board and the power supply device including the same, a cover layer is formed on a surface of an area other than the connection area thermally connected to the heat radiating member, so that the size of the surface-shaped exposure area which the conductive pattern is exposed can be adjusted. Further, the cover layer covers a part of a surface of the exposed conduct pattern, so that a conductor is restrained from being damaged, especially, at a time of carrying the printed circuit board while maintaining the heat radiating property of the conductor.

Here, as configurations by which the effect is effectively achieved, in detail, a magnetic core comprising a flat plate portion and a leg portion, and interposes the printed circuit board, wherein the printed circuit board has an open hole portion, which the leg portion of the magnetic core is inserted into, the surface-shaped exposure area corresponds to a coil pattern formed around the open hole portion, and the cover layer formed at a location corresponding to the flat plate portion of the magnetic core when the magnetic core interposes the printed circuit board.

By the above configuration, the cover layer is formed at a location corresponding to the flat plate portion of the magnetic core, so that the cover layer can restrain the conductor from being damaged at the time of carrying the printed circuit board, and can maintain an insulation property between the magnetic core and the conductor at a time of assembling.

Further, the thickness of the conductor forming the surface-shaped exposure area may be smaller than two times the thickness of the cover layer.

In this way, the thickness of the conductor is thinner than two times the thickness of the cover layer, so that even when the printed circuit boards overlap each other such that surfaces in which the conductive pattern is formed face each other, the exposed conductive patterns are restrained from being in contact with each other. Thus, the printed circuit boards can be restrained from being damaged at the time of carrying them.

Further, a dummy portion comprising a surface-shaped conductive pattern and a cover layer formed on the surface of the conductive pattern, is additionally provided in an area other than the surface-shaped exposure area within the one surface of the substrate.

In this way, a dummy portion comprising a surface-shaped conductive pattern and a cover layer is formed, so that the printed circuit boards can be restrained from being damaged at the time of carry them.

In accordance with the present invention, provided are a printed circuit board in which a high heat radiating property is maintained while being restrained from being damaged at the time of carrying them and a power supply device including the printed circuit board.

DETAILED DESCRIPTION

Hereinafter, a form for implementing the present invention will be described in detail with reference to the accompanying drawings. Further, in the description of the drawings, the same element will be designated by the same reference numeral and a duplicate description thereof will be omitted.

Figure 1:
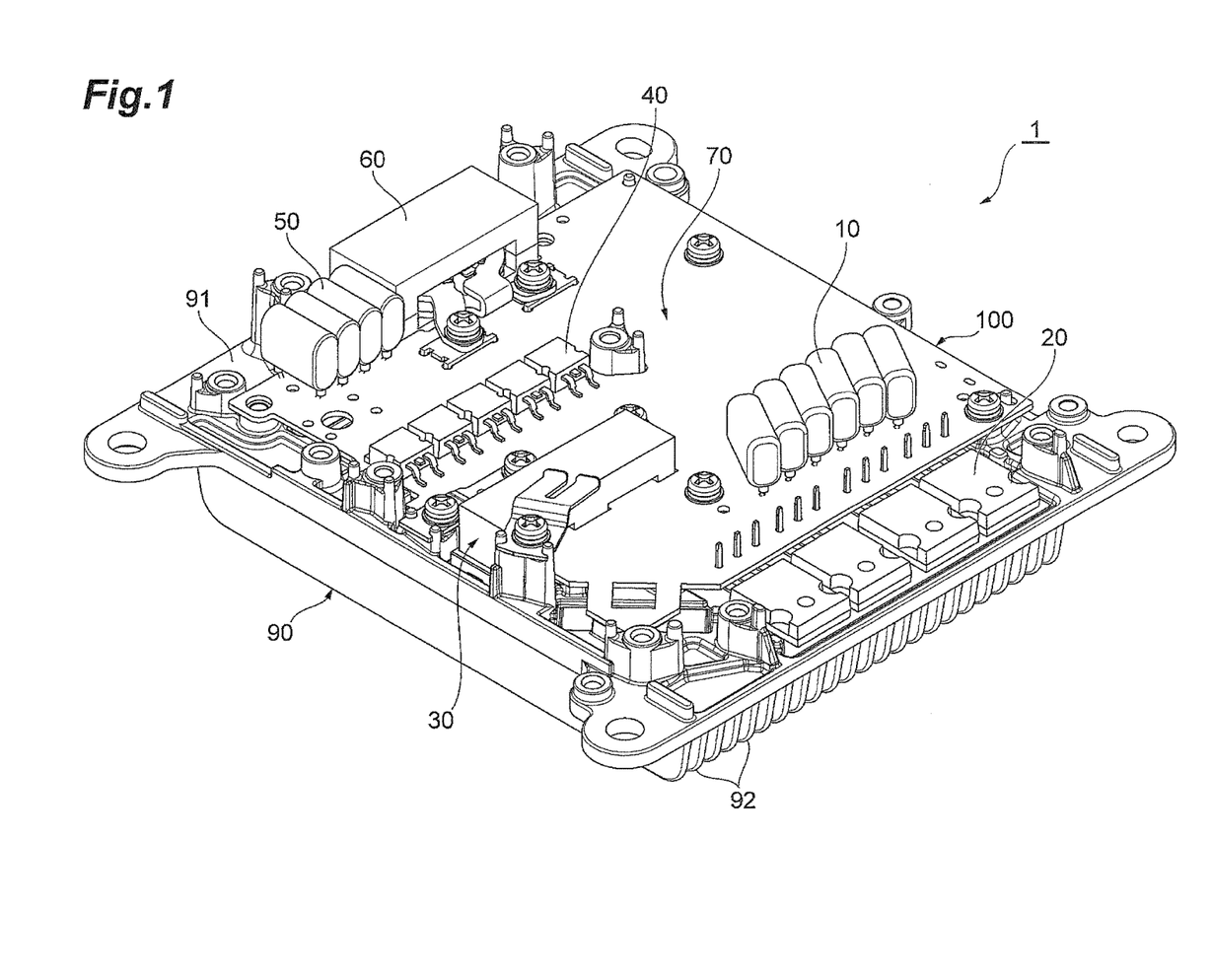
FIG. 1 is a perspective view illustrating a schematic configuration of a power supply device to which a printed circuit board is mounted according to an embodiment of the present invention.
Figure 2:
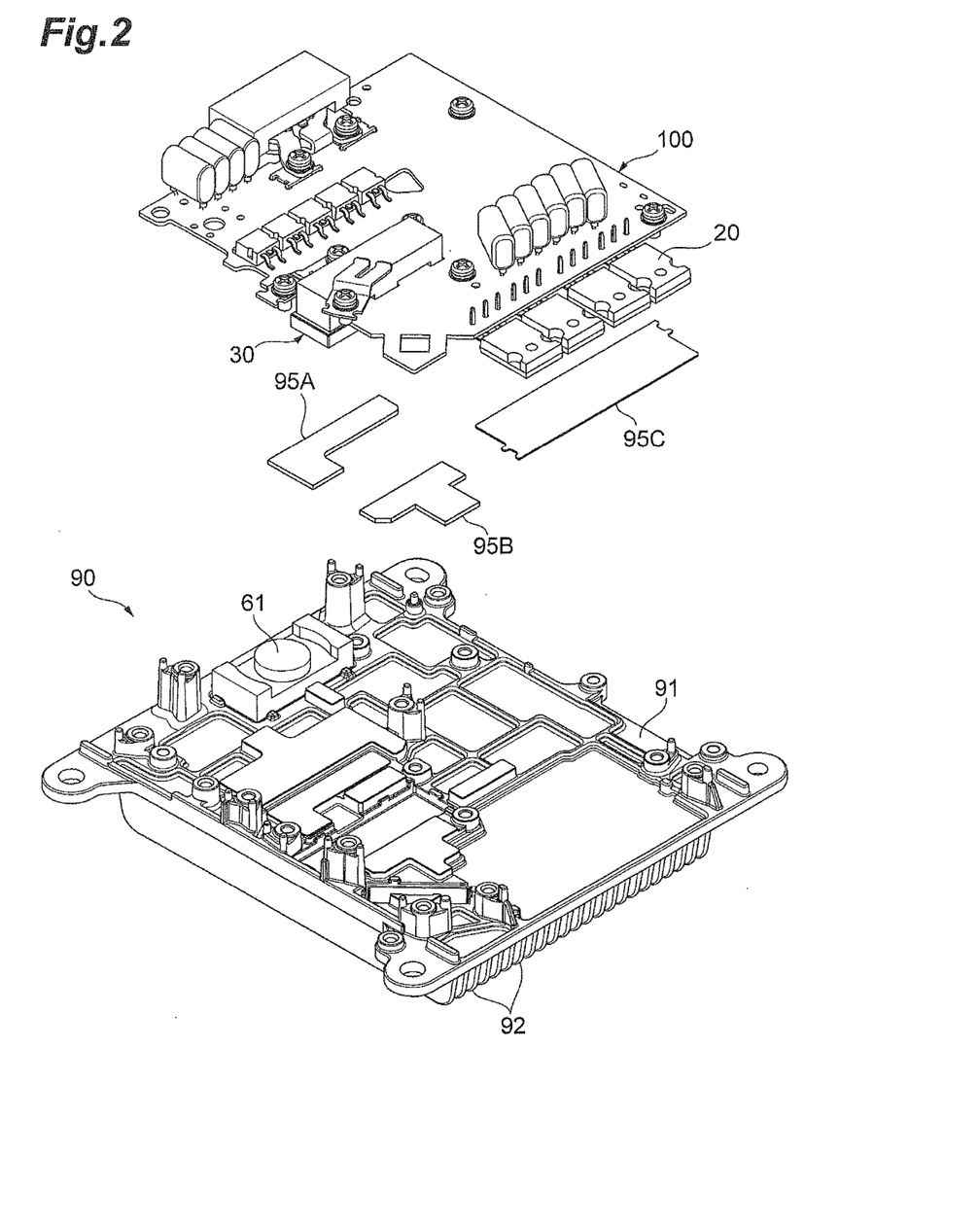
FIG. 2 is an exploded perspective view illustrating a schematic configuration of a power supply device of FIG. 1.

FIG. 1 is a perspective view illustrating a schematic configuration of a power supply device to which a printed circuit board is mounted according to an embodiment of the present invention. Further, FIG. 2 is an exploded perspective view schematically illustrating the power supply device of FIG. 1. There is a switching power supply device for a vehicle which is an example of the power supply device described in the present embodiment.

In a power supply device 1, electronic components, such as an input smoothing capacitor 10, a switching element 20, a transformer 30, a rectifying device 40, an output smoothing capacitor 50, a choke coil 60, and a controller 70, are connected to a printed circuit board 100 serving as a main circuit board, which is provided at a base plate 91 configuring a lower part of a housing 90. Further, some of the electronic components are not illustrated in FIGS. 1 and 2. Further, the exploded perspective view of FIG. 2 illustrates a state in which a lower core 61 among magnetic cores constituting the choke coil 60 is placed on the base plate 91 of the housing 90.

The housing 90 constitutes a part of a metallic case for accommodating constituent members of the power supply device 1. In the power supply device 1, the electronic components are accommodated in the housing 90 and the housing 90 is then covered by a cover (not illustrated). The housing is formed of a metal such as aluminum, etc., and a heat radiating fin 92 is installed on a rear surface (lower sides of FIGS. 1 and 2: a surface opposite to a surface on which elements and substrates are fixed) of the base plate 91 constituting a bottom surface of the housing 90. Further, the heat radiating fin 92 is cooled through air so that the rear surface of the base plate 91 is cooled. Thus, heat generated by each electronic component disposed in the power supply device 1 and fixed on a surface of the base plate 91 is transferred to the base plate 91 and is dissipated from the rear surface of the base plate 91 to the outside. In this way, the base plate 91 functions as a heat sink having a heat radiating function. Meanwhile, the base plate 91 and the heat radiating fin 92 may be formed by different members, and may be formed by the same member. Further, the present invention may have a configuration in which a cooling liquid flow channel for water-cooling is installed on the rear surface of the base plate 91, to cool the rear surface of the base plate 91 through water, so as to dissipate heat from the rear surface of the base plate 91 to the outside, instead of a configuration in which the heat radiating fin is mounted for air-cooling.

As illustrated in FIG. 2, heat radiating sheets (heat radiating members) 95A to 95C are installed on an upper surface of the base plate 91. A heat radiating sheet configured of a material having a high heat conductivity property and an elasticity property and, sold in the market, may be applied as the heat radiating sheets 95A to 95C. As illustrated in FIG. 2, the printed circuit board 100 to which each of the electronic components is connected is placed on the heat radiating sheets 95A and 95B, and the switching element 20 which dissipates a large amount of heat among the electronic components connected to the printed circuit board 100 is placed on the heat radiating sheet 95C, at the same time. Thereafter, the printed circuit board 100 is fixed to the base plate 91 by screw-fixing, etc.

Figure 3:
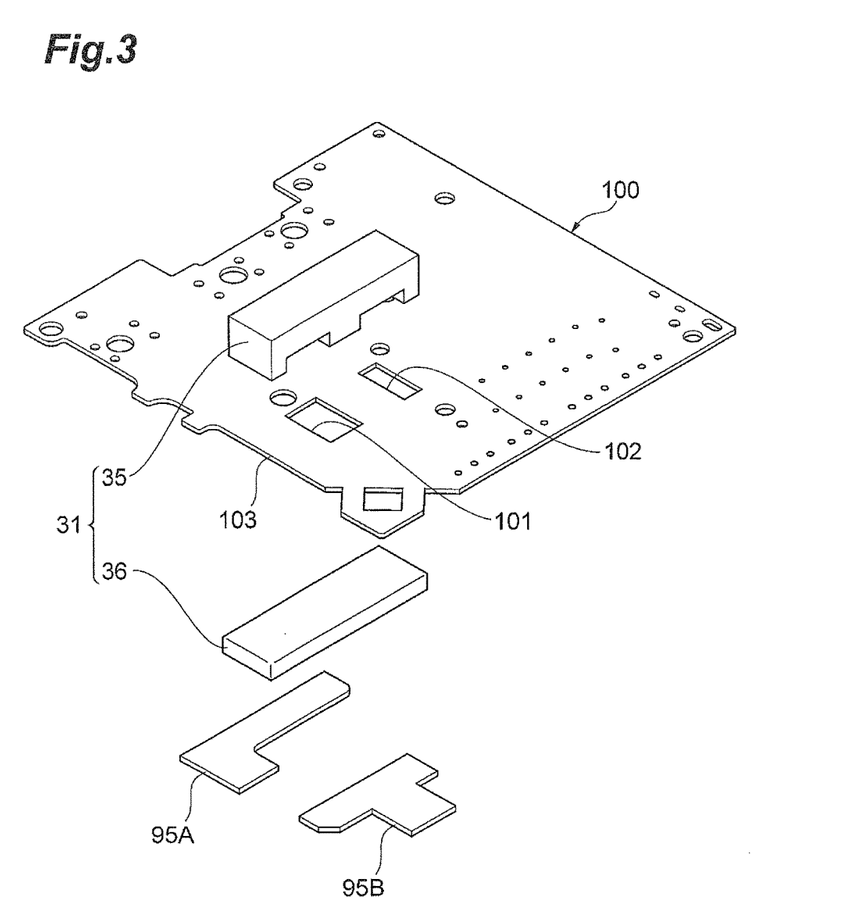
FIG. 3 is an exploded perspective view illustrating a configuration of a transformer.

A pattern in which electronic components are connected to each other as a conductive pattern and a pattern functioning as a coil of a transformer or an inductor are formed in the printed circuit board 100. Here, a configuration around the transformer 30 among the printed circuit board 100 will be described with reference to FIG. 3. FIG. 3 is an exploded perspective view illustrating the transformer 30. The transformer 30 includes a coil, and a magnetic core 31 according to a conductive pattern printed in the printed circuit board 100. The magnetic core 31 corresponds to a so-called EI-shaped magnetic core, and has a configuration in which an E-shaped core 35 and an I-shaped core 36 are opposed to each other. The E-shaped core 35 comprising three leg portions extending from a flat plate portion having a shape of a plate. The I-shaped core 36 comprising a shape of a flat plate. Further, open hole portions 101 and 102 passing through the two leg portions among the three leg portions of the E-shaped core 35 of the magnetic core 31 are provided in the printed circuit board 100. Among the open hole portions 101 and 102 and the three leg portions of the E-shaped core 35, the E-shaped core 35 and the I-shaped core 36 are disposed to face each other via a leg portion arrangement area 103 to which the leg portions not passing through the open hole portions 101 and 102 of the printed circuit board 100 are mounted so that a part of the conductive pattern printed in the printed circuit board 100 functions as a coil of the transformer or the inductor.

Figure 4:
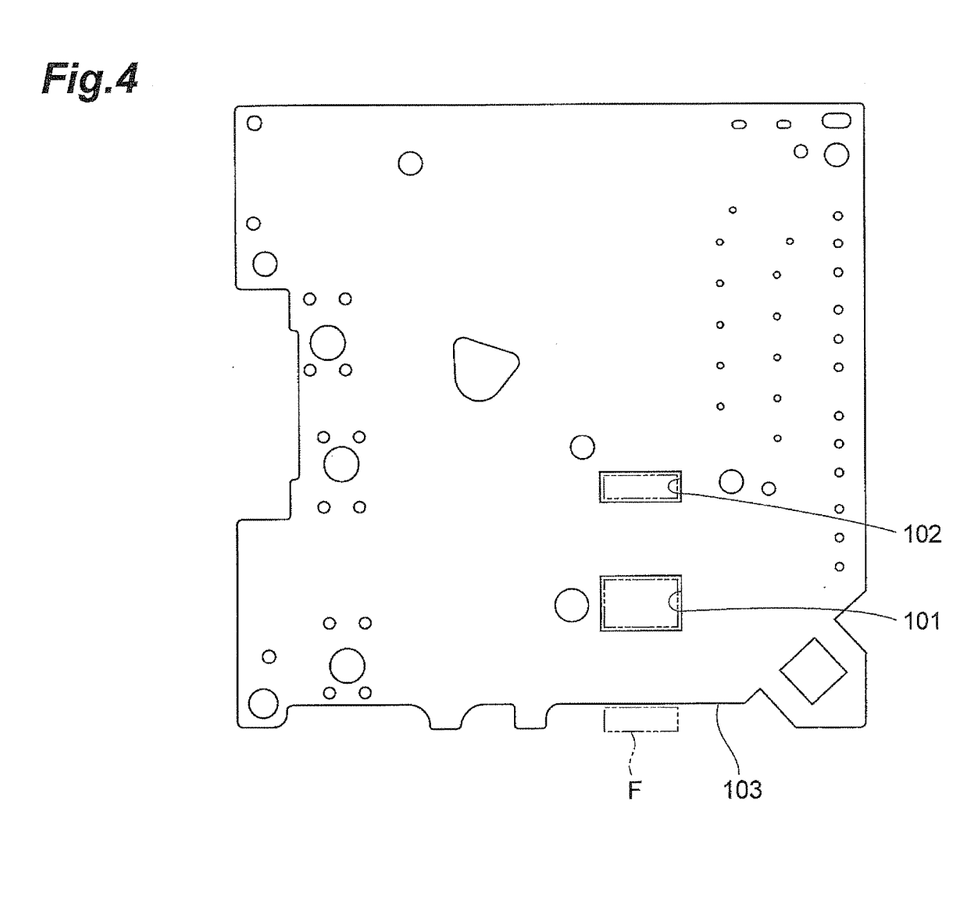
FIG. 4 is a top view of the printed circuit board.
Figure 5:
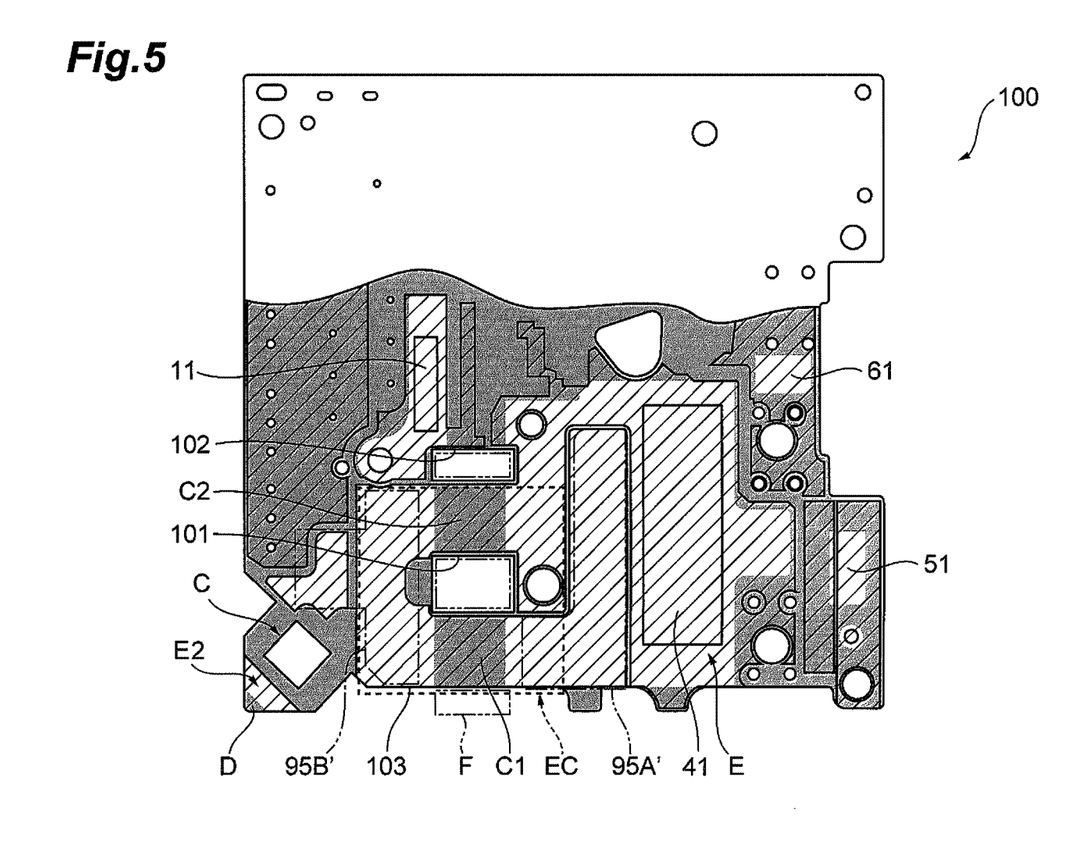
FIG. 5 is a bottom view of the printed circuit board, and schematically illustrates a conductive pattern of an interior of some areas and an arrangement of a cover layer.

Here, the printed circuit board 100 will be further described with reference to FIGS. 4 and 5. FIG. 4 illustrates an upper surface of the printed circuit board 100, and FIG. 5 illustrates a lower surface of the printed circuit board 100. In some parts of FIGS. 4 and 5, an arrangement of a conductive pattern E and a cover layer C in the printed circuit board 100 is schematically illustrated. The printed circuit board 100 is obtained by coating an upper side thereof, which corresponds to a side to which the aforementioned electronic components are mounted, with an insulation material such as resist, etc., and by forming, at a lower side thereof, a pattern configured by a conductor such as a copper foil, etc. The pattern configured by the conductor is exposed to interiors of the open hole portions provided in the substrate, and terminals of the electronic components are inserted/passed into/through the open hole portion, so that the electronic components and the conductor in the printed circuit board 100 are connected to each other. Further, for example, a wiring pattern for connecting the open hole portions to each other in order to electrically connect electronic components to each other and a coil pattern functioning as a coil constituting the transformer are formed at a lower surface corresponding to one surface of the printed circuit board 100. Although the thickness of a conductive pattern E may be properly changed, a range of the thickness of the conductive pattern E may be, for example, 18 µm to 105 µm. Further, in FIGS. 4 and 5, a location where the leg portion of the E-shaped core 35 in the magnetic core 31 is provided when performing assembling is indicated as a leg portion F.

In the printed circuit board 100 according to the present embodiment, although the pattern is formed by removing an unnecessary portion from the substrate in which the copper foil is attached to the entire surface thereof, by etching, etc., a method of attaching a conductive pattern to a rear side of the substrate configured by the insulation material may be employed. Further, the conductive pattern is formed on the insulation material, the resist is then formed by coating or printing, and a processing for protecting a surface of the conductive pattern E and a lower surface of the substrate is then performed, so that a cover layer C is formed. Although the thickness of the resist is properly changed, a range of the thickness may be, for example, 15 μm to 70 μm. Further, it is preferred that a thickness of the conductor of the conductive pattern E is smaller than two times the thickness of the resist (the cover layer C). This point will be described later.

The processing will be described in detail with reference to FIG. 5. FIG. 5 illustrates an area where the conductive pattern E is provided by an oblique line, and illustrates the cover layer C for protecting the surface of the conductive pattern and a lower surface of the substrate by a gray color. As illustrated in FIG. 5, in the printed circuit board 100 according to the present embodiment, a surface-shaped area is formed around the open hole portions 101 and 102 which the two leg portions of the E-shaped core 35 of the magnetic core 31 insert/pass into/through and around the leg portion arrangement area 103 where the other leg portion is formed, and a coil pattern EC functioning as a coil is provided. That is, the coil pattern EC is configured to wind around the leg portion of the E-shaped core 35 of the magnetic core 31 when the magnetic core 31 is mounted to the printed circuit board 100.

Here, most of an area where the conductive pattern is formed to protect the conductor, except for an area around an opening used for connection with the electronic components, is covered by the cover layer C. However, in the printed circuit board 100 according to the present embodiment, a heating value of the coil pattern EC is high, and a heat radiating property is aimed to be high, so that the coil pattern EC is not covered by the cover layer C and is exposed to the outside. That is, the coil pattern EC is exposed to the outside, and functions as a surface-shaped exposure area having a shape of a flat surface. Further, the exposed coil pattern EC is installed to be in contact with the heat radiating sheets 95A and 95B in order to improve a heat radiating efficiency caused by the coil pattern EC. Each of the heat radiating sheets 95A and 95B is directly connected to the base plate 91 or is indirectly connected to the base plate 91 via a member having a high thermal conductivity such as a thermal compound, etc., so that the coil pattern EC is thermally connected to the heat radiating member. In FIG. 5, areas (connection areas) where the heat radiating sheets 95A and 95B are in contact with each other to be thermally connected to each other are designated by reference numerals 95A' and 95B. As illustrated in FIG. 5, in the printed circuit board 100 according to the present embodiment, an area including the coil pattern EC and the connection area 95A' includes at least a part of the connection areas 95A' and 95B' which are thermally connected to the heat radiating member when performing assembling, is exposed to the outside, and functions as a surface-shaped exposure area, at the same time.

Here, in the printed circuit board 100, when the magnetic core 31 is mounted to the printed circuit board 100, the cover layer C is formed at a location corresponding to the flat plate portion of the magnetic core 31. In detail, in the coil pattern EC, a cover layer C1 (covered area) is formed between the open hole portion 101 and the leg portion arrangement area 103, a cover layer C2 (covered area) is formed between the open hole portion 101 and the open hole portion 102 at the same time.

An effect generated by that the cover layers C1 and C2 are formed on the coil pattern EC, which corresponds to a surface-shaped exposure area exposed to the outside for the heat radiating, will be described. Although the printed circuit board 100 according to the related art has a configuration in which the cover layer covers an approximate entirety of the surface of the conductive pattern, a configuration in which a surface-shaped exposure area in which the conductive pattern E of the coil pattern EC is exposed is formed and is thermally connected to the heat radiating member has been considered in order to improve a heat radiating property of the printed circuit board 100. However, by enlarging the surface-shaped exposure area, the heat radiating property of the conductor can be improved, but there is a concern that the conductor may be damaged. The conductor of the printed circuit board 100 is likely to be damaged by making the substrates become in contact with each other while overlapping and moving the substrates, when the substrates move before assembling the power supply device, rather than after the power supply device 1 is completely assembled while accommodating the printed circuit board 100 in the housing 90.

Thus, the printed circuit board 100 according to the present embodiment can achieve an effect which restrains the damage of the conductor, especially, when moving the substrates, while maintaining a heat radiating property of the conductor by adjusting a size of the surface-shaped exposure area in which the conductive pattern E is exposed, by installing the cover layers C1 and C2 on a surface other than the connection areas 95A' and 95B' within the coil pattern EC which is the surface-shaped exposure area exposed to the outside.

Further, an area where the cover layers C1 and C2 are installed is an area corresponding to the flat plate portion of the magnetic core 31 when the magnetic core 31 is mounted to the printed circuit board 100, so that the cover layers C1 and C2 can achieve an effect which maintains insulation between the magnetic core 31 and the conductive pattern E of the printed circuit board 100.

In this way, the cover layers C1 and C2 need to be provided in order to prevent the exposed coil patterns EC from being in contact with each other. When the printed circuit boards overlap each other by the thicknesses of the cover layers C1 and C2 in order to carry the printed circuit boards, the conductor can be restrained from being damaged. Thus, when heat radiating is not disturbed, most of an area of the cover layers C1 and C2 on the coil pattern EC may be allocated to the cover layer.

Further, a process about forming of the cover layers C1 and C2 may be implemented in a process of forming resist, which is generally performed when the printed circuit board 100 is manufactured. That is, the conductor can be restrained from being damaged, without adding a process of installing the cover layers C1 and C2.

Figure 6:
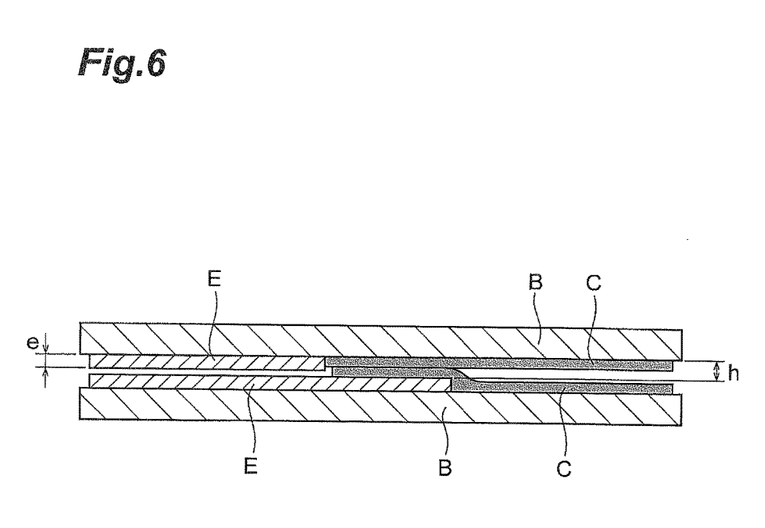
FIG. 6 is a diagram about the conductive pattern and a thickness of the cover layer.

Next, an effect of when the thickness of the conductor of the conductive pattern E is smaller than two times the thickness of the resist (cover layer C) will be described with reference to FIG. 6. FIG. 6 illustrates a configuration in which two printed circuit boards overlap each other. Each of the two printed circuit boards has a configuration in which the conductive pattern E is formed on the substrate B and the cover layers C are formed on the substrate B and the conductive pattern E. Here, as illustrated in FIG. 6, when the substrates overlap each other such that surfaces in which the conductive patterns E are installed to face each other, the conductive patterns E installed in the two substrates may be damaged while being in contact with each other. Therefore, when the cover layer C is formed on the conductive pattern E, e denotes the thickness of the conductor of the conductive pattern E, and h denotes two times the thickness of the cover layer C, h is set to be larger than e, so that the conductive patterns E can be prevented from being in contact with each other. Thus, the conductive pattern E can be restrained.

Although the embodiment of the present invention has been described above, the printed circuit board and the power supply device according to the present invention are not limited thereto, and it is possible to make various modifications of the printed circuit board and the power supply device.

For example, although it has been described in the above embodiment that the present invention has a configuration in which the cover layers C1 and C2 formed by resist are installed on a surface of an area other than the connection areas 95A' and 95B' within the coil pattern EC so that the printed circuit board 100 is restrained from being damaged when the printed circuit boards 100 are carried while being overlapping each other, the present invention may have a configuration in which the cover layer is formed by methods other than the resist, such as silk print, etc.

Further, for example, as in the cover layers C1 and C2 described in the present embodiment, the cover layers C1 and C2 are formed to block a part of the passage in an extending direction of the coil pattern EC, that is, in a direction in which a current flows, so that the areas of the cover layers C1 and C2 are secured. In addition, the shape of the cover layers C1 and C2 may be properly changed.

Further, the present invention may have a configuration in which areas, other than the surface-shaped exposure area within the surface on which the coil pattern EC is formed, are additionally provided with a surface-shaped conductive pattern E2 and a dummy portion D (See FIG. 5) formed on the surface of the conductive pattern E2, the cover layer being formed on the dummy portion D. In this case, since the dummy portion is provided between the overlapped printed circuit boards when the printed circuit boards overlap each other, the printed circuit boards can be further restrained from being damaged when being carried.

Further, although it has been described in the above embodiment that when performing assembling, the connection area thermally connected to the heat radiating member is included and the coil pattern EC is installed as a surface-shaped exposure area exposed to the outside and provided with a flat-surface-shaped conductive pattern at the same time, a location where such a surface-shaped exposure area is installed is not limited to the coil pattern wound with respect to the magnetic core of the transformer, and may be installed in other areas within the conductive pattern. As illustrated in FIG. 5, the other areas include, for example, a choke coil pattern 61 formed by configuring a coil of the choke coil 60 as a coil pattern within the printed circuit board 100, a rectifying device correspondence unit 41 which faces a mounting surface of a heat-emitting component such as the rectifying device, and an input smoothing capacitor correspondence unit 11, or an output smoothing capacitor correspondence unit 51, which faces a mounting surface of an input smoothing capacitor 10 or an output smoothing capacitor 50 emitting low heat but having a rated temperature range of which the upper limitation is relatively low.

What is claimed is:

1. A printed circuit board assembly, comprising:
   a printed circuit board including:
      a substrate comprised of an insulation material;
      a hole; and
      a conductive pattern formed on a surface of the substrate, the conductive pattern including:
         a first side in contact with the substrate; and
         a second side opposite the first side, the second side having a surface-shaped coil pattern formed around the hole, the coil pattern including:
            a connection area thermally connected to a heat radiating member; and
            a covered area outside of the connection area where a cover layer is formed, a thickness of a conductor forming the coil pattern being smaller than two times a thickness of the cover layer; and
   a magnetic core disposed on the printed circuit board, the magnetic core including:
      a leg disposed inside the hole; and
      a flat plate that overlaps the covered area when viewed perpendicularly to the printed circuit board.

2. The printed circuit board assembly according to claim 1, further comprising:
   a dummy portion on a different portion of the surface of the substrate than the surface-shaped exposure area, including:
      a second conductive pattern; and
      a second cover layer formed on a surface of the second conductive pattern.

3. A power supply device comprising:
   the printed circuit board assembly set forth in of claim 1; and
   a housing for accommodating the printed circuit board assembly,
   wherein the coil pattern is installed on a lower surface of the printed circuit board, the coil pattern is thermally connected to the housing, and a bottom surface of the housing functions as the heat radiating member.

* * * * *